May 13, 1969 G. A. KENT ET AL 3,444,425

TELEVISION VERTICAL DEFLECTION CIRCUIT

Filed June 24, 1966 Sheet 1 of 2

INVENTOR.
George A. Kent
BY Richard J. Waring
Pendleton, Neuman, Seibold & Williams
Attorneys INVENTOR.
George A. Kent
Richard J. Waring
BY Pendleton, Neuman, Seibold & Williams
Attorneys United States Patent Office 3,444,425
Patented May 13, 1969

3,444,425

TELEVISION VERTICAL DEFLECTION CIRCUIT

George A. Kent, Fort Wayne, and Richard J. Waring, Auburn, Ind., assignors to The Magnavox Company, Fort Wayne, Ind., a corporation of Delaware Filed June 24, 1966, Ser. No. 560,259
Int. Cl. H01j 29/70
U.S. Cl. 315—27 3 Claims

ABSTRACT OF THE DISCLOSURE

A vertical deflection circuit for use in a transistorized television receiver is described. The circuit includes a blocking oscillator, a driver stage, and an output stage, the vertical deflection coils being directly coupled to the output stage. A thermistor is provided in the base circuit of the output transistor and is put in thermal contact with that transistor to stabilize the output current of the transistor.

This invention relates to a television vertical deflection circuit and more particularly to a television vertical deflection circuit using transistors, which is highly stable and reliable in operation and which produces an accurately linear scan, while using a minimum number of component parts and being readily and economically manufacturable.

This invention was evolved with the general object of providing a television receiver using transistors in the vertical deflection circuit, having high reliability so as to provide trouble-free operation, and operative to deflect the beam of a picture tube with a high degree of linearity.

A further object of the invention is to provide a transistorized vertical deflection circuit which can be readily adjusted to obtain optimum operation and which will continue to provide optimum operation once adjusted.

According to this invention, a vertical deflection circuit is provided including a power transistor in an output stage which is coupled to vertical deflection coils and including a transistor operative as an emitter-follower in a driver stage, to present a high input impedance to a sawtooth wave-generating oscillator while presenting a low output impedance to the input of the output stage. With this arrangement, a high degree of isolation is thus obtained between the oscillator and the output stage.

An important feature of the circuit is in the direct coupling of the power transistor of the output stage to the vertical deflection coils or yoke, preferably with a DC blocking capacitor to eliminate DC components from the yoke current.

A specific feature of the circuit is in the provision of an inductor between the collector of the power transistor and the power supply, in parallel relation to the yoke, the inductor having a relatively high impedance as compared to that of the yoke.

Another specific feature is in the provision of an adjustable resistor in the emitter circuit of the power transistor for controlling the amount of degeneration and to thereby control the output of the power stage and the vertical size of the raster.

Additional important features relate to the biasing of the power transistor to obtain high linearity and adequate output power. In particular, a pair of resistors are used to connect the base electrode of the power transistor to a power supply with one of the resistors being adjustable to compensate for variations in transistor beta characteristics and to obtain an optimum value of collector current flow. This feature is important because beta characteristics can vary substantially from one transistor to another.

Another specific feature is in the provision of a thermistor to compensate for temperature changes within the output power transistor, the thermistor being preferably connected in circuit between the base of the power transistor and the power supply, and being located physically in heat-conductive relation to the power transistor.

The use of the emitter-follower driver stage is particularly important in combination with the bias control and temperature compensation features in providing isolation such that the bias adjustment and temperature compensation changes have no effect on the adjustment of the sawtooth oscillator. It is also important in that the emitter-follower has a low output impedance and supplies a signal to the base circuit of the power transistor with a high degree of stability.

Still another feature of the invention is in the provision of feedback means from the emitter electrode of the power transistor to the driver stage input for regulating the linearity of the sawtooth wave produced at the power stage output. Here again, the use of the emitter-follower driver stage is important in minimizing interaction of adjustments and in providing a high degree of stability.

A still further feature of the invention is in the provision of a vertical oscillator including a transistor operative as a blocking oscillator. The oscillator can be accurately adjusted and can be readily locked to a synchronizing signal. In addition, it has a high degree of stability, so long as it operates into a high impedance such as is presented by the emitter-follower driver stage.

This invention contemplates other and more specific objects, features and advantages which will become more fully apparent from the following detailed description taken in conjunction with the accompanying drawings which illustrate a preferred embodiment and in which.

Figures 1, 3:
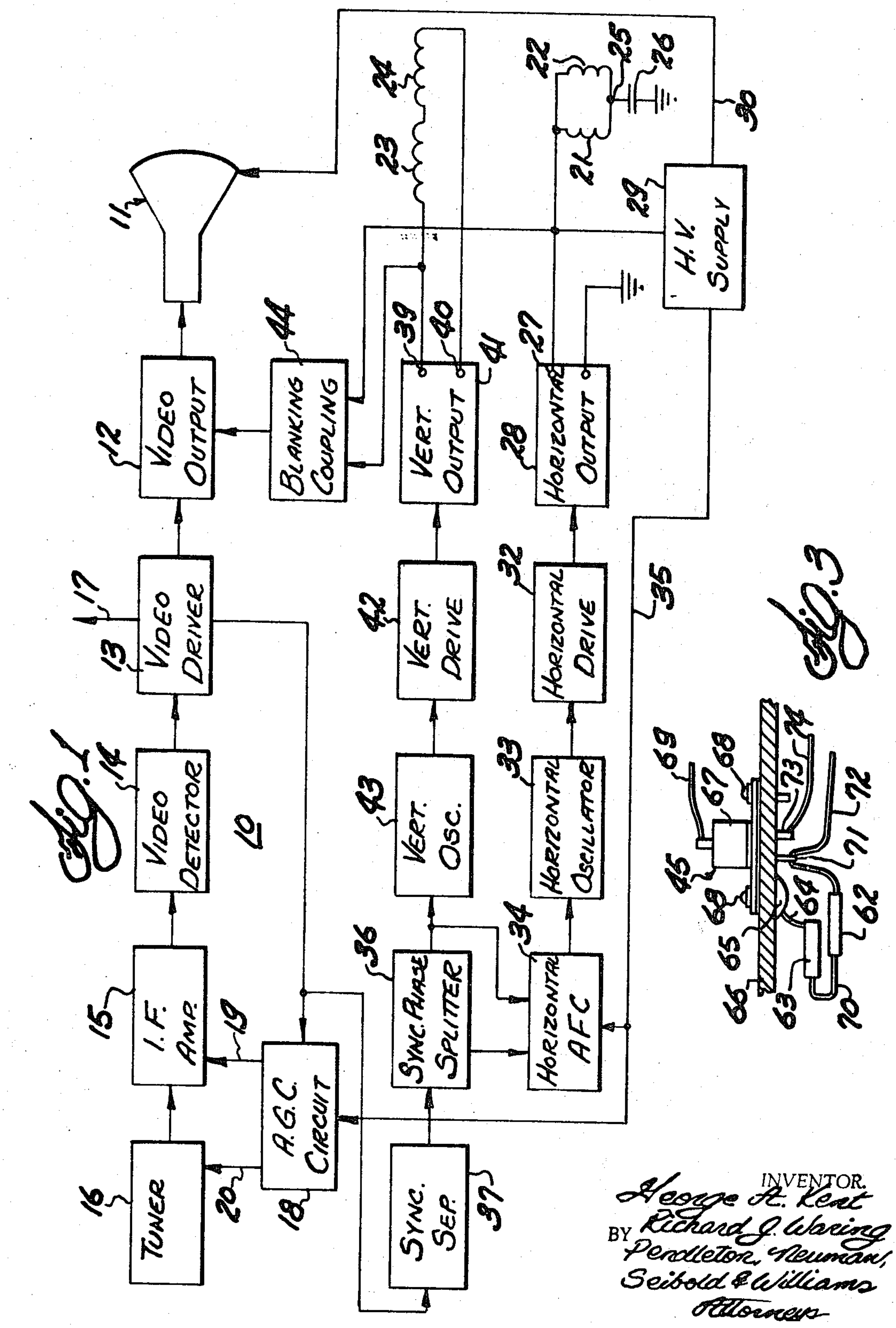
FIGURE 1 is a schematic block diagram of a television receiver constructed in accordance with the principles of this invention.
FIGURE 3 is a cross-sectional view showing the mounting of a power transistor and a thermistor of the vertical output stage of the receiver.

Reference numeral 10 generally designates a receiver constructed in accordance with the principles of this invention. The invention is particularly concerned with a vertical deflection circuit shown in FIGURE 2, but the overall construction of the receiver will be first described with reference to the block diagram of FIGURE 1.

The receiver 10 comprises a picture tube 11 having a conventional electron gun structure to which a video signal is applied from a video output stage 12, driven by a video driver stage 13, which receives a video signal from a video detector 14. The detector 14 receives a modulated signal from an IF amplifier 15 which, in turn, receives a modulated signal from a tuner 16. An output signal from the driver stage 13 may be applied through a line 17 to a sound channel (not shown) which may comprise a sound IF amplifier, a ratio detector, an audio amplifier and a sound reproducer or speaker.

Another output of the video driver stage 13 is applied to an automatic gain control circuit 18 which applies control voltage signals through lines 19 and 20 to the IF amplifier 15 and the tuner 16 to maintain the level of the detected video signal substantially constant.

To deflect the electron beam and to produce a raster on the screen of the picture tube 11, a pair of horizontal deflection coils 21 and 22 and a pair of vertical deflection coils 23 and 24 are provided. The horizontal deflection coils 21 and 22 are connected in parallel between a circuit point 25, connected through a capacitor 26 to ground, and an output terminal 27 of a horizontal output stage 28. Out put terminal 27 is also connected to a high voltage supply 29 which supplies a high voltage to the screen of the picture tube 11, through a line 30. The horizontal output stage 28 is driven through a horizontal driver stage 32 from a horizontal oscillator stage 33 which is controlled by a horizontal automatic frequency control stage 34. One input of the stage 34 is connected to receive a flyback pulse through an output line 35 of the high voltage supply 29, which may also be connected to the automatic gain control circuit 18.

To synchronize the operation of the horizontal oscillator with synchronizing pulse portions of the received signal, and to thereby synchronize the horizontal deflection with the horizontal deflection in the camera at the television broadcast station, the horizontal automatic frequency control circuit 34 has additional inputs connected to outputs of a synchronizing signal phase splitter circuit 36, which receives a signal from a synchronizing signal separator circuit 37, having an input connected to an output of the video driver stage 13. The synchronizing signal separator circuit operates to develop pulses in response to synchronizing pulse portions of the video signal developed by the detector 14.

The invention is particularly concerned with the vertical deflection system. In this system, the vertical deflection coils 23 and 24 are connected to output terminals 39 and 40 of a vertical output stage 41 which operates to supply a sawtooth signal at the vertical repetition rate (normally 60 cycles per second). The output stage 41 has an input connected to the output of a driver stage 42, the driver stage 42 having an input connected to the output of a vertical oscillator 43. Oscillator 43 operates to supply a sawtooth signal which is synchronized with vertical synchronizing portions of the received signal, an input of the oscillator 43 being connected to the output of the synchronizing signal phase splitter circuit 36.

It is here noted that although it does not form a part of the present invention, by itself, a blanking signal coupling circuit 44 is provided having a pair of inputs connected to output terminals 27 and 39 of the horizontal and vertical output stages 28 and 41 and having an output connected to the video output stage 12, for the purpose of blanking the picture tube 11 during retrace intervals.

Figures 2, 4:
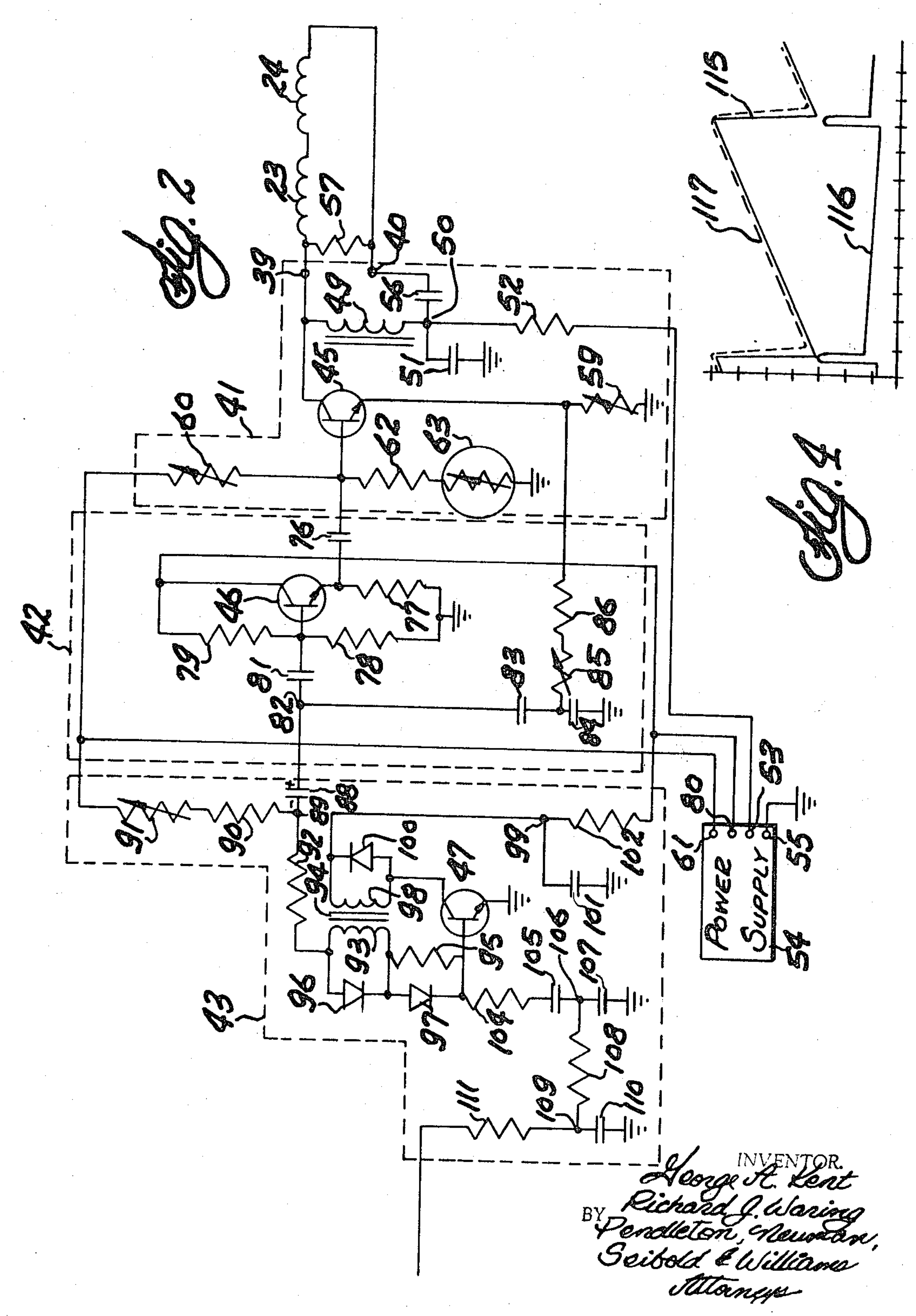
FIGURE 2 is a circuit diagram showing the circuits of a vertical oscillator stage, a vertical driver stage and a vertical output stage of the receiver of FIGURE 1.
FIGURE 4 is a graphical illustration showing the relationship between power transistor voltages and yoke current.

FIGURE 2 shows the circuits of the vertical output stage 41, the vertical driver stage 42 and the vertical oscillator stage 43, which are transistorized in accordance with this invention. In general, the vertical output stage comprises a power transistor 45 having a collector coupled directly to the deflection coil 23 and having a base coupled to the emitter of a transistor 46 in the driver stage 42, the base of the transistor 46 being connected to the output of the oscillator 43 which includes a transistor 47 operated as a blocking oscillator.

In accordance with this invention, the transistor 46 is operated as an emitter-follower to provide a low impedance output for driving the output stage 41 to obtain highly stable operation thereof, and to provide a high impedance input to the oscillator stage 43 to obtain stable operation thereof and to obtain a firm lock of its operation to the synchronizing signal. The characteristics of the driver stage 42 are also very important in providing isolation between the output and oscillator stages 41 and 43 and in minimizing interaction between adjustments and operating condition variations which may occur in the stages 41 and 43. As a result, the circuits can be readily adjusted to obtain optimum operation and, once adjusted, will continue to provide optimum operation over prolonged periods of time, thereby obviating the need for repeated adjustments.

In the output stage 41, the collector of the transistor 45 is directly connected to terminal 39 and is connected through an inductor 49 to a circuit point 50 which is connected through a capacitor 51 to ground and through resistor 52 to an output terminal 53 of a power supply 54 having a terminal 55 connected to ground. Capacitor 51 and resistor 52 together form a decoupling filter, to minimize transient variations at the circuit point 50 and to stabilize the voltage thereof. Circuit point 50 is connected to the output terminal 40 through a capacitor 56 which is thereby coupled in series with the deflection coils 23 and 24. The capacitor 56 functions as a blocking capacitor to prevent application of DC current components to the deflection coils 23 and 24.

The inductor 49 provides a path for flow of DC current to the transistor 45 and has an inductance such as to provide a relatively high impedance as compared to the impedance of the deflection or yoke coils 23 and 24. During retrace time, a large positive pulse is developed by the coils 23 and 24 and moves the beam in the picture tube 11 from the bottom of the screen to the top thereof.

The emitter of the transistor 45 is connected to ground through an adjustable resistor 59 which serves as a picture height control, by controlling the amount of degeneration in the stage. When the resistance is increased, the degeneration is increased to reduce the output and to reduce the vertical size of the raster. The resistor 59 also serves to prevent thermal run-away of the transistor 45, which might otherwise occur because as the collector current increases, the temperature of the transistor also increases to allow more collector current to flow and so on. Further, the resistor 59 serves to develop a sawtooth voltage which is applied to a wave shaping circuit as described hereinafter.

The transistor 45 is biased for class A operation, through resistance means connected between the base of the transistor 45 and the power supply 54. In particular, the base of the transistor 45 is connected through an adjustable resistor 60 to a terminal 61 of the power supply 54 and is connected to ground through a resistor 62 in series with a thermistor 63. Resistor 60 is adjusted to compensate for variations in transistor beta characteristics and to obtain an optimum value of collector current flow in the transistor 45. The adjustment can be readily made by placing a meter across the resistor 52 and adjusting the resistor 60 until a predetermined indication is obtained on the meter, corresponding to the optimum collector current flow for the transistor 45.

The thermistor 63 is used to compensate for temperature changes within the output transistor 45, to protect the transistor 45 and to maintain the collector current substantially constant so as to stabilize the operation. As shown in FIGURE 3, the thermistor 63 has a ground lead 64 affixed by solder 65 to a chassis 66 at a point close to the transistor 45. Transistor 45 includes a case 67 which is connected internally to the collector and which is secured by screws 68 to the chassis 66, a thin sheet of insulation, preferably mica, being provided between the case 67 and the chassis 66. As also illustrated, a wire 69, connected to the case 67, is used for connection to the terminal 39. An opposite lead 70 of the thermistor 63 is connected to one lead of the resistor 62 the other lead of which is connected to the base terminal 71 of the transistor 45, base terminal 71 being also connected to a wire 72 for connection to the resistor 60, while an emitter terminal 73 is connected to a wire 74 for connection to the resistor 59.

With the ground lead 64 of the thermistor 63 being soldered to the chassis 66, changes in chassis temperature resulting from changes in the temperature of the transistor 45 are conducted to the thermistor 63 to change the resistance thereof. For example, when the temperature increases, the resistance of the thermistor 63 is reduced, which lowers the forward bias applied to the base of the transistor 45 to lower the collector current. Thus the collector current is automatically stabilized.

The base of the power transistor 45 is connected through a coupling capacitor 76 to the emitter of the transistor 46 which is connected through a resistor 77 to ground. The base of transistor 46 is connected through a resistor 78 to ground and also through a resistor 79 to the collector thereof, which is connected to an output terminal 80 of the power supply 54. The base of transistor 46 is further connected through a capacitor 81 to a circuit point 82 at which a sawtooth voltage is developed by the blocking oscillator stage 43.

The output waveform from the blocking oscillator 43, developed at the circuit point 82, may be quite non-linear so as not to produce a satisfactory vertical sweep. For example, the waveform might be such as to produce severe stretching at the top of the picture and compression at the bottom. In the illustrated circuit, a feedback arrangement is provided, which may be adjusted to obtain an accurately linear output waveform. In particular, circuit point 82 is connected through capacitors 83 and 84 in series to ground, the junction between capacitors 83 and 84 being connected through an adjustable resistor 85 and a fixed resistor 86 to the emitter of the power transistor 45 in the output stage 41. A parabolic waveform is developed at the junction between capacitors 83 and 84 having an amplitude and phase controlled by adjustment of the resistor 85, the parabolic waveform being added to the oscillator waveform through the capacitor 83, to produce a corrected waveform at the circuit point 82 which when applied through the emitter-follower transistor 46 to the power transistor 45, results in generation of a waveform between output terminals 39 and 40 such as to produce an accurately linear sawtooth waveform of current in the deflection coils 23 and 24. FIG. 4 illustrates the relationship between the base drive, collector voltage and yoke current for the vertical output circuit 41 and yoke 23–24. The solid line 115 illustrates the typical signal applied to the base of transistor 45, the solid line 116 represents the collector voltage, and the broken line 117 shows the actual yoke current. The effect of the linear retrace in limiting output voltage and in providing an optimum current waveform is apparent from the curves.

The blocking oscillator stage 43 comprises a capacitor 88 which is connected between circuit point 82 and a circuit point 89, connected through a fixed resistor 90 and a variable resistor 91 to the power supply terminal 61. Circuit point 89 is additionally connected through a resistor 92, a winding 93 of a transformer 94 and a resistor 95 to the base of the transistor 47, diodes 96 and 97 being connected in parallel with the winding 93 and the resistor 95, respectively. The emitter of the transistor 47 is connected to ground while the collector thereof is connected through another winding 98 of the transformer 94 to a circuit point 99, a diode 100 being connected in parallel with the winding 98. Circuit point 99 is connected through a capacitor 101 to ground and through a resistor 102 to the power supply terminal 80, the capacitor 101 and resistor 102 forming a decoupling filter.

In operation, when the receiver is initially turned on, the transistor 47 is forward biased and the collector current thereof increases. The increasing current flows through the transformer winding 98 and induces a voltage in the winding 93 which has a negative polarity at the upper end, connected to the resistor 92 and a positive polarity at the lower end, connected to the resistor 95. Thus a positive voltage is applied to the base of the transistor 47 through the diode 97 and further increases the bias of the transistor so that more collector current flows. As a result, the transistor 47 rapidly goes into saturation conduction. During this action, a pulse of relatively high amplitude is developed in the secondary winding 93 which is negative at the end thereof which is connected through resistor 92 to the capacitor 88, charging the capacitor 88 with a polarity as indicated on the drawing. When the transistor 47 becomes saturated, the collector current thereof ceases to change and the induced voltage in the transformer windings falls toward zero. This reduces the collector current and thus voltages are induced across the windings 93 and 98 of reversed polarity, to which the diodes 96 and 100 act as short-circuits, to dissipate the energy stored in the transformer.

The capacitor 88, however, remains charged and through the winding 93 and the resistor 95, the transistor 47 is cut off. The only discharge path for the capacitor 88 is then through the resistors 90 and 91. The capacitor 88 then discharges toward the supply voltage and after a time interval dependent upon the time constant of the circuit, as determined by the capacitance of the capacitor 88 and the resistance of the resistors 90 and 91, the capacitor 88 becomes positively charged to a value sufficient to forward bias the transistor 47 and initiate conduction thereof, thereby repeating the cycle.

To synchronize the operation of the oscillator 43 with the received signal, the base of the transistor 47 is connected through a resistor 104 and a capacitor 105 to a circuit point 106 forming an output terminal of an integrating circuit, circuit point 106 being connected through a capacitor 107 to ground and through a resistor 108 to a circuit point 109 which is connected through a capacitor 110 to ground and through a resistor 111 to the output of the synchronizing signal phase splitter circuit 36. The elements 107, 108, 110 and 111 integrate the synchronizing pulses to develop a pulse at the field rate at the circuit point 106, applied through capacitor 105 and resistor 104 to the base of the transistor 47 to be superimposed on the biasing voltage developed by the capacitor 88 and to properly time the starting point of each cycle. It is noted that the diode 97 provides a high impedance to the synchronizing pulse, so that the full amplitude of the pulse is applied to the base of the transistor 47. To obtain proper operation, the resistor 91, which functions as a vertical hold control, is adjusted so that the free-running frequency of the oscillator is slightly lower than the repetition rate of the vertical synchronizing pulses.

Once adjusted, the blocking oscillator 43 operates with a high degree of stability. In achieving such stability, it is important that it operate into a high impedance load, such as is presented by the input circuit of the emitter-follower stage 42, and it is also important that the blocking oscillator 43 be decoupled from other signal sources, the emitter-follower stage 42 being effective to provide a high degree of isolation. Thus adjustment of the bias-control resistor 60 and variations in the resistance of the thermistor 63 have minimal effect on the operation of the oscillator 43. Likewise, the operation of the oscillator 43 is not substantially affected by adjustment of the vertical size control resistor 59 or of the linearity control resistor 85.

By way of illustrative example and not by way of limitation, the components of the illustrated circuit may have the following values.

| Reference numeral: | | Value |
|---|---|---|
| 51 | microfarads | 100 |
| 52 | ohms | 22 |
| 56 | microfarads | 250 |
| 57 | ohms | 39,000 |
| 59 | do | 15 |
| 60 | do | 15,000 |
| 62 | do | 1200 |
| 63 | do | 3000 |
| 76 | microfarads | 250 |
| 77 | ohms | 1000 |
| 78 | do | 100,000 |
| 79 | do | 82,000 |
| 81 | microfarads | 10 |
| 83 | do | 1.5 |
| 84 | do | 50 |
| 85 | ohms | 200 |
| 86 | do | 33 |
| 88 | microfarads | 0.33 |
| 90 | ohms | 82,000 |
| 91 | do | 100,000 |
| 92 | do | 8200 |

| Reference numeral: | | Value |
|---|---|---|
| **95** | ohms | 220,000 |
| **101** | microfarads | 200 |
| **102** | ohms | 100 |
| **104** | do | 82,000 |
| **105** | microfarads | 0.033 |
| **107** | do | 0.022 |
| **108** | ohms | 8200 |
| **110** | microfarads | 0.015 |
| **111** | ohms | 10,000 |

The power supply 74 may supply voltages of plus 12 volts at terminals 61 and 80 and a voltage of plus 68 volts at terminal 53.

The vertical deflection yoke coils 23 and 24 have an inductance of about 565 millihenries. Thus it is possible to directly couple the collector of the output transistor to the yoke with an appropriate impedance match.

We claim as our invention:

1. In a television circuit, a vertical oscillator operative to generate a sawtooth wave, a driver stage having an input coupled to said oscillator for application of said sawtooth wave thereto and having an output, an output stage having an input coupled to said driver stage output and having an output, and a DC power supply means, said driver stage including a transistor operative as an emitter-follower to present a high input impedance to said oscillator and a low output impedance to said input of said output stage while isolating said oscillator from said output stage, and said output stage including a power transistor having base, emitter, and collector electrodes with means connecting said emitter electrode to one terminal of said power supply means, output means for said output stage coupled to said power supply means and to said collector electrode, and a pair of resistance means connecting said base electrode to said power supply means to bias said base electrode, one of said resistance means including a thermistor in heat-conductive relation to said power transistor and arranged to change the bias of said base electrode to compensate for temperature changes and to stabilize collector current flow through said power transistor.

2. The television circuit as defined in claim 1 wherein said one of said resistance means connects said base electrode with said one terminal of said power supply means.

3. The television circuit as defined in claim 1 wherein one lead of said thermistor is mechanically affixed to a point closely adjacent the case of said power transistor to provide said heat-conductive relation.

References Cited

UNITED STATES PATENTS

| | | | |
|---|---|---|---|
| 3,147,397 | 9/1964 | Michaelson | 315—27 |
| 3,174,073 | 3/1965 | Massman et al. | 315—27 |
| 3,247,419 | 4/1966 | Attwood | 315—27 |

RODNEY D. BENNETT, Jr., *Primary Examiner.*

C. L. WHITHAM, *Assistant Examiner.*